(12) United States Patent
Goel et al.

(10) Patent No.: US 9,583,396 B2
(45) Date of Patent: Feb. 28, 2017

(54) MAKING A DEFECT FREE FIN BASED DEVICE IN LATERAL EPITAXY OVERGROWTH REGION

(71) Applicant: Intel Corporation, Santa Clara, CA (US)

(72) Inventors: Niti Goel, Portland, OR (US); Benjamin Chu-Kung, Portland, OR (US); Sansaptak Dasgupta, Hillsboro, OR (US); Niloy Mukherjee, Portland, OR (US); Matthew V. Metz, Portland, OR (US); Van H. Le, Portland, OR (US); Jack T. Kavalieros, Portland, OR (US); Robert S. Chau, Beaverton, OR (US); Ravi Pillarisetty, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/777,730

(22) PCT Filed: Jun. 28, 2013

(86) PCT No.: PCT/US2013/048776
§ 371 (c)(1),
(2) Date: Sep. 16, 2015

(87) PCT Pub. No.: WO2014/209398
PCT Pub. Date: Dec. 31, 2014

(65) Prior Publication Data
US 2016/0204036 A1   Jul. 14, 2016

(51) Int. Cl.
*H01L 21/8238* (2006.01)
*H01L 21/02* (2006.01)
(Continued)

(52) U.S. Cl.
CPC ............ *H01L 21/823807* (2013.01); *H01L 21/02532* (2013.01); *H01L 21/02538* (2013.01);
(Continued)

(58) Field of Classification Search
CPC ............... H01L 29/66795; H01L 21/02532
(Continued)

(56) References Cited

U.S. PATENT DOCUMENTS

| | | | |
|---|---|---|---|
| 2010/0163842 A1* | 7/2010 | Lai | H01L 29/785 257/19 |
| 2010/0301390 A1* | 12/2010 | Ko | H01L 29/7851 257/190 |

(Continued)

FOREIGN PATENT DOCUMENTS

| | | |
|---|---|---|
| KR | 1020050066963 | 6/2005 |
| KR | 1020060005041 | 1/2006 |

OTHER PUBLICATIONS

Intel Corporation, Taiwan office action for Application No. 103120844, (Nov. 2, 2015).
(Continued)

*Primary Examiner* — Moazzam Hossain
(74) *Attorney, Agent, or Firm* — Blakely, Sokoloff, Taylor & Zafman LLP

(57) ABSTRACT

Electronic device fins may be formed by epitaxially growing a first layer of material on a substrate surface at a bottom of a trench formed between sidewalls of shallow trench isolation (STI) regions. The trench height may be at least 1.5 times its width, and the first layer may fill less than the trench height. Then a second layer of material may be epitaxially grown on the first layer in the trench and over top surfaces of the STI regions. The second layer may have a second width extending over the trench and over portions of (Continued)

top surfaces of the STI regions. The second layer may then be patterned and etched to form a pair of electronic device fins over portions of the top surfaces of the STI regions, proximate to the trench. This process may avoid crystalline defects in the fins due to lattice mismatch in the layer interfaces.

23 Claims, 5 Drawing Sheets

(51) Int. Cl.
*H01L 21/762* (2006.01)
*H01L 29/66* (2006.01)

(52) U.S. Cl.
CPC .. *H01L 21/02647* (2013.01); *H01L 21/76224* (2013.01); *H01L 21/823821* (2013.01); *H01L 21/823878* (2013.01); *H01L 29/66795* (2013.01)

(58) Field of Classification Search
USPC .......................................................... 438/429
See application file for complete search history.

(56) References Cited

U.S. PATENT DOCUMENTS

| 2011/0097881 | A1* | 4/2011 | Vandervorst | H01L 29/66795 438/486 |
| 2013/0234147 | A1* | 9/2013 | Wu | H01L 29/66795 257/76 |
| 2015/0221735 | A1* | 8/2015 | Joshi | H01L 21/02233 257/330 |

OTHER PUBLICATIONS

Intel Corporation, et al., International search report and written opinion mailed Mar. 27, 2014 for PCT/US2013/048776.
International Preliminary Report on Patentability dated Jan. 7, 2016 for International Application No. PCT/US2013/048776.

* cited by examiner

MAKING A DEFECT FREE FIN BASED DEVICE IN LATERAL EPITAXY OVERGROWTH REGION

CROSS-REFERENCE TO RELATED APPLICATION

This patent application is a U.S. National Phase Application under 35 U.S.C. §371 of International Application No. PCT/US2013/048776, filed Jun. 28, 2013, entitled MAKING A DEFECT FREE FIN BASED DEVICE IN LATERAL EPITAXY OVERGROWTH REGION.

BACKGROUND

Field

Circuit devices and the manufacture and structure of fin based circuit devices.

Description of Related Art

Increased performance in circuit devices on a substrate (e.g., integrated circuit (IC) transistors, resistors, capacitors, etc. on a semiconductor (e.g., silicon) substrate) is typically a major factor considered during design, manufacture, and operation of those devices. For example, during design and manufacture or forming of metal oxide semiconductor (MOS) transistor devices, such as those used in a complementary metal oxide semiconductor (CMOS), it is often desired to increase movement of electrons in N-type MOS device (n-MOS) channels and to increase movement of positive charged holes in P-type MOS device (p-MOS) channels. However, performance and movement are slowed by lattice mismatches and defects generated in a between layers of materials used to form the MOS.

For some CMOS implementation, the co-integration of lattice mismatched materials like III-V material epitaxial growth on Silicon is a big challenge. Currently there is no state of art solution to co-integrate n- and p-MOS material epitaxial growths on to a single Silicon substrate. Thus, in current applications, due to large lattice mismatch in materials, defects are generated when novel materials (III-V, Germanium (Ge)) are grown on a Silicon material substrate.

DETAILED DESCRIPTION

Figure 1:
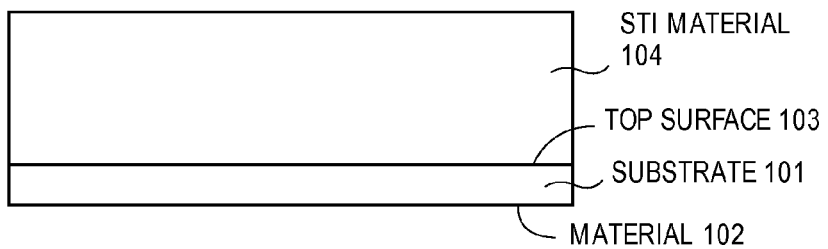
FIG. 1 is a schematic cross section view of a portion of a semiconductor substrate base after forming a layer of shallow trench isolation (STI) material on a top surface of the substrate.

Large lattice mismatch in materials may generate defects when certain materials (e.g., type III-V, or Germanium (Ge) materials) are epitaxially grown on a Silicon material substrate (e.g., single crystal silicon). In some cases, the materials may be epitaxially grown from a substrate surface, in trenches between shallow trench isolation (STI) regions. The growth may be patterned and etched to form "fins" of material in or on which devices may be formed. Thus, the defects may exist in "fins" of material in or on which devices may be formed, after the fins are patterned and etched from the growths.

For example, defects may be trapped or along the sidewall of the STI forming the trenches by making the Height (H) of the trench larger than the width (W) and length (L) of the trench such that ratios H/W>=1.5 and H/L>=1.5. This ratio may give a minimum H/W ratio limit to block many defects within a buffer layer formed within the trench. However, there are other defects, including the Stacking faults that originate at the STI sidewall, that still remain within the trench.

Defect density improvements may be accomplished by growth optimizations/tricks in blanket film growths. However, there may not be a reduction of such defects in a trench. These defects propagate throughout the trench and can lead to yield and variations issues in a device built on a device layer formed from epitaxial growth extending above the trench. This propagation may exist in "fin" devices formed in fins that are patterned and etched from epitaxial growth extending above the trench. Such fin devices may include fin integrated circuit (IC) transistors, resistors, capacitors, etc. formed in or on sidewalls of "fins" grown from or extending above a semiconductor (e.g., silicon) substrate or other material. Such devices may include fin metal oxide semiconductor (MOS) transistor devices, such as those used in a complementary metal oxide semiconductor (CMOS) based on movement of electrons in N-type MOS device (n-MOS) channels and movement of positive charged holes in P-type MOS device (p-MOS) channels.

According to embodiments, such defects can be avoided by epitaxially growing a first layer of material on a substrate surface at a bottom of a trench formed between sidewalls of shallow trench isolation (STI) regions. Then a second layer of material may be epitaxially grown on the first layer in the trench and over top surfaces of the STI regions. The second layer may have a second width extending over the trench and over portions of top surfaces of the STI regions. The second layer may then be patterned and etched to form a pair of electronic device fins over portions of the top surfaces of the STI regions, proximate to the trench. This process may avoid crystalline defects in the fins due to lattice mismatch in the layer interfaces. For example, defects (e.g., crystalline defects) in the trench may not have extended into or not exist in the lateral epitaxy overgrowth regions (e.g., part of the second layer width extending over portions of top surfaces of the STI regions). Thus, the fins formed from that material may provide electronic device material (e.g., wells and channels) in which defect free fin based devices may be formed.

FIG. 1 is a schematic cross section view of a portion of a semiconductor substrate base after forming a layer of STI material on a top surface of the substrate. FIG. 1 shows semiconductor substrate or base 101 of material 102 having top surface 103. Substrate 101 may include, be formed from, deposited with, or grown from silicon, polycrystalline silicon, single crystal silicon, or various other suitable technologies for forming a silicon base or substrate, such as a silicon wafer. For example, according to embodiments, substrate 101 may be formed by growing a single crystal silicon substrate base material having a thickness of between 100 Angstroms and 1000 Angstroms of pure silicon. Alternately, substrate 101 may be formed by sufficient chemical vapor deposition (CVD) of various appropriate silicon or silicon alloy materials 102 to form a layer of material having a thickness between one and three micrometers in thickness, such as by CVD to form a thickness of two micrometers in thickness. It is also considered that substrate 101 may be a relaxed, non-relaxed, graded, and/or non-graded silicon alloy material 102. Material 102 may be a relaxed material (e.g., have a non-strained lattice) at surface 103. Material 102 may be a single crystal silicon material. Substrate 102 may be made of silicon and have top surface 103 with a (100) crystal oriented material (e.g., according to Miller Index). Substrate 101 may be a "miscut" substrate.

FIG. 1 also shows a layer of shallow trench isolation (STI) material 104 formed or grown on top surface 103 of the substrate 101. STI material 104 may be formed of an oxide or a nitride or combination thereof. STI material 104 may be formed of SiC or another material as know in the art. STI material 104 may be formed by atomic layer deposition (ALD) or chemical vapor deposition (CVD). STI material 104 is generally deposited via Plasma Enhanced Chemical Deposition (PECVD). In some cases, STI material 104 is formed by ALS, CVD, PECVD of TEOS+O2+RF at 400° C. In some cases, any of various oxygen precursors, Silane precursors, or generic precursors can be used during a process (e.g., PECVD) to form STI material 104, as know in the art.

The bottom surface of material 104 may have the same (100) crystal orientation as that of material 102 (e.g., at surface 103). In some cases, the bottom surface of material 104 may have the same crystal lattice size as that of material 102 (e.g., at surface 103). Material 104 may be a relaxed material (e.g., have a non-strained lattice) with respect to its interface (e.g., where material 104 is chemically or atomically bonded to surface 103 below) with surface 103.

Figure 2:
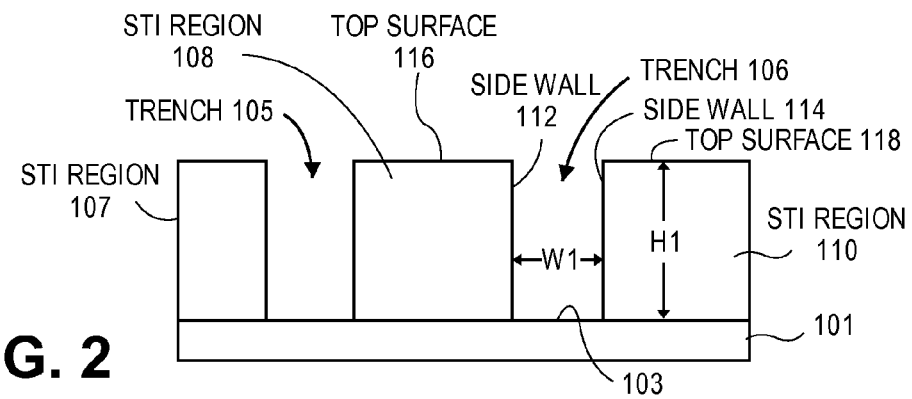
FIG. 2 shows the semiconductor substrate of FIG. 1 after forming STI regions and trenches between the STI regions.

FIG. 2 shows the semiconductor substrate of FIG. 1 after forming STI regions and trenches between the STI regions. FIG. 2 shows trenches 105 and 106 defined between STI regions 107, 108 and 110 and surface 103. Regions 107, 108 and 110 may be formed by patterning and etching as known in the art. This may include forming a blanket layer of STI material 104, then patterning and etching material 104 to form STI regions 107, 108 and 110. In some cases, patterning and etching material 104 to form the STI regions includes using a resist or hard mask underneath a resist for the patterning materials. In some cases 1, 2, or 3 resist layers may be used for the patterning materials. In some cases, patterning and etching material 104 to form the STI regions includes using an O2 or O2/Ar plasma etch at pressures in the 10-100 mTorr range, and at room temperature. Such patterning and etching may also include etching an oxides including STI material, by etching with fluorocarbons (e.g., CF4 and/or C4F8), O2 and Ar, at pressures in the 10-100 mTorr range, and at room temperature.

STI region 108 has sidewall 112 and top surface 116. STI region 110 has sidewall 114 and top surface 118. Sidewalls 112 and 114 may be vertical planar surfaces perpendicular to (e.g., at a right angle with respect to) horizontal planar surfaces surface 103 and horizontal planar surfaces 116 and 118. The sidewalls may comprise or be STI material 104. The STI regions 108 and 110 may have a width of at between 100 and 1000 nano-meters (nm).

Trenches 105 and 106 may be defined by the sidewalls of regions 107, 108 and 110. More specifically FIG. 2 shows trench 106 defined by or having a side at sidewall 112 of region 108, a side at sidewall 114 of region 110, a bottom at top surface 103, and a top adjacent (e.g., proximate) to top surfaces 116 or 118. Trenches 105 and 106 may include surface 103 of material 102 exposed at the bottom of the trench, such as a planar or planarized surface of crystal material. In some cases, each of trenches 105 and 106 is defined by additional sidewalls of other STI regions, such as a front and back STI having sidewall similar to sidewalls 112 and 114, and top surfaces similar to surfaces 116 or 118, but defining length L of trench 106.

Trench 106 may have width W1 defined by the horizontal distance between sidewall 112 of region 108 and side at sidewall 114 of region 110. Width W1 may be a width of between 10 and 100 nanometers (nm). In some cases W1 is approximately 25 nm.

Trench 106 may have height H1 defined by the vertical distance between top surface 103 and top surface 116 or 118. Height H1 may be a height of between 30 and 300 nanometers (nm). In some cases H1 is approximately 75 nm. H1 of the trench may be larger than the W1 of the trench such that ratio H1/W1 is >=1.5. In some cases, the ratio H1/W1 is =1.5. In some cases, the ratio H1/W1 is >=2.0.

Trench 106 may have a length L1 defined as the length going into the page and along sidewall 112 or sidewall 114. Length L1 may be a length of between 10 and 100 nanometers (nm). In some cases L1 is approximately 25 nm. In some cases L1 is equal to (or approximately the same as) W1. H1 of the trench may be larger than the L1 of the trench such that ratio H1/L1 is >=1.5. In some cases, the ratio H1/L1 is =1.5. In some cases, the ratio H1/L1 is >=2.0. According to some embodiments, W1 may be between 10 and 15 nanometers (nm) and H1 may be 350 nanometers (nm). Optionally L1 may be equal to W1.

FIG. 2 shows trenches 105 and 106 defined between STI regions 107, 108 and 110 and surface 103. However it is contemplated that more, similar trenches and regions may exist on substrate 101 (e.g., such as at least hundreds or hundreds of thousands).

Figure 3:
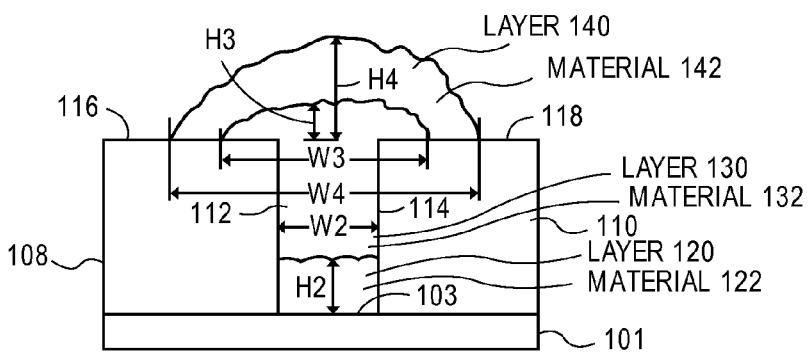
FIG. 3 shows the semiconductor substrate of FIG. 1 after forming epitaxial material in the trenches between the STI regions.

FIG. 3 shows the semiconductor substrate of FIG. 1 after forming epitaxial material in the trenches between the STI regions. FIG. 3 shows forming epitaxial material in trench 106, however it is contemplated that trench 106 represents any number of trenches formed in STI regions on substrate 101. FIG. 3 shows first layer 120 of material 122 epitaxially grown from surface 103 in trench 106. Material 122 may be epitaxially grown from the crystal surface 103 of substrate surface 103. Material 122 may be formed by epitaxial growth (e.g., heteroepitaxy) using atomic layer deposition (ALD) or chemical vapor deposition (CVD) and may only grow from "seed" surface 103 below into the trench, but not grow from the STI sidewalls or STI top surfaces. Choice of growth deposition like growth temperature, pressure of gas flux, etc may define the selectivity of the epitaxial growth. In some cases, the growth of layer 120 is grown selectively from surface 103 by choosing or using a predetermined growth temperature range, pressure of gas flux range, etc., as known for material 122 to grow from material of surface 103, but not grow from or initiate on material of the STI sidewall or top surfaces.

Material 122 may be a first layer of crystalline material that has height H2 from surface 103 which is less than H1. Material 122 may have a bottom surface having a (100) crystal oriented material grown from surface 103, and side surfaces having a (110) crystal oriented material along or adjacent to sidewalls 112 and 114. In some embodiments, crystalline defects may exist in material 122 near or along the sidewalls 112 and 114 of the STI forming the trenches. In some embodiments, crystalline defects may exist in material 122 due to defects, including the Stacking faults that originate at the STI sidewalls 112 or 114, that still remain within the trench 106.

Material 122 may have a top surface having a (100) crystal orientation (Miller Index). The top surface of layer 120 may be polished or etched to form a flat surface having a (100) crystal index. Layer 120 may have width W2 between sidewalls 112 and 114. W2 may be less than or equal to W1. In some cases, the difference in width may be due to crystalline defects in material 122. Layer 120 may have a length L1.

Layer 120 may have height H2 defined by the vertical distance between top surface 103 and a top surface of layer 120. Height H2 may be a height of between 50-150 nanometers (nm). In some cases H2 is approximately 70 nm. In some cases, layer 120 is a layer of InP or GaAs material.

The bottom surface of layer 120 may have the same (100) crystal orientation as that of material 102 (e.g., at surface 103). In some cases, the bottom surface of layer 120 may have the same crystal lattice size as that of material 102 (e.g., at surface 103). Layer 120 may be a relaxed material (e.g., have a non-strained lattice) with respect to its interface with surface 103. In some cases, layer 120 is a relaxed layer (partially or fully) with respect to the substrate (e.g., surface 103).

FIG. 3 shows second layer 130 of material 132 epitaxially grown from a top surface of layer 120. Material 132 may be epitaxially grown from the crystal top surface of layer 120. Material 132 may be formed by epitaxial growth (e.g., heteroepitaxy) using chemical vapor deposition (CVD) and may only grow from "seed" top surface of layer 120 below into the trench, but not grow from the sidewalls or STI top surfaces. In some cases, the growth of layer 130 is grown selectively from the top surface of layer 120 (e.g., from material 122) by choosing or using a predetermined growth temperature range, pressure of gas flux range, etc., as known for material 132 to grow from material 122, but not grow from or initiate on material of the STI sidewall or top surfaces.

Material 132 may be a second layer of crystalline material that has a height defined by the vertical distance between a top surface of layer 120 and a top surface of layer 130. A portion of the height of layer 130 may be height H3 extending above or over top surfaces 116 and 118 of STI regions 108 and 110. Material 132 may have a bottom surface having a (100) crystal oriented material grown from layer 120, and side surfaces having a (110) crystal oriented material along or adjacent to sidewalls 112 and 114. In some embodiments, crystalline defects may exist in material 132 near or along the sidewalls 112 and 114 of the STI forming the trenches. In some embodiments, crystalline defects may exist in material 132 due to defects, including the Stacking faults that originate at the STI sidewalls 112 or 114, that still remain within the trench 106. Material 132 may have a top surface having a (100) crystal orientation (Miller Index). The top surface of layer 130 may be polished or etched to form a flat surface having a (100) crystal index.

Layer 130 may have horizontal width W3 extending across or over the trench (e.g., W1) and portions of top surfaces 116 and 118 of STI regions 108 and 110. W3 may be greater than (e.g., and include) W1. In some cases, crystalline defects in material 132 near or along the sidewalls 112 and 114 of the STI do not extend into the portion of layer 130 having height H3 and width W3. Layer 130 may have a length L1.

Layer 130 may have vertical height H3 above or over top surfaces 116 and 118 of STI regions 108 and 110. Height H3 may be a height of between 5-100 nanometers (nm). In some cases H3 is approximately 20 nm. According to some embodiments, the difference in height between the top of layer 120 and the top of layer 130 may be 200 nanometers (nm).

The bottom surface of layer 130 may have the same (100) crystal orientation as that of material 122 (e.g., at its top surface). In some cases, the bottom surface of layer 130 may have the same crystal lattice size as that of material 122 (e.g., at its top surface). Layer 130 may be a relaxed material (e.g., have a non-strained lattice) with respect to its interface with layer 120 (e.g., at its top surface). In some cases, layer 130 is a relaxed layer (mostly or fully) with respect to layer 120 (e.g., a top surface of material 122).

FIG. 3 shows third layer 140 of material 142 epitaxially grown from a top surface of layer 130. Layer 140 may be a "device" layer, such as a layer on or in which circuitry devices are formed, as known in the art. Such devices may include devices described herein.

Material 142 may be epitaxially grown from the crystal top surface of layer 130. Material 142 may be formed by epitaxial growth (e.g., heteroepitaxy) using chemical vapor deposition (CVD) and may only grow from "seed" top surface of layer 130 below into the trench, but not grow from the sidewalls or STI top surfaces. In some cases, the growth of layer 140 is grown selectively from the top surface of layer 130 (e.g., from material 132) by choosing or using a predetermined growth temperature range, pressure of gas flux range, etc., as known for material 142 to grow from material 132, but not grow from or initiate on material of the STI sidewall or top surfaces.

Material 142 may be a third layer of crystalline material that has a height defined by the vertical distance between a top surface of layer 130 and a top surface of layer 140. Layer 140 may have height H4 extending above or over top surfaces 116 and 118 of STI regions 108 and 110. H4 may be greater than H3.

Material 142 may have a bottom surface having a (100) crystal oriented material grown from layer 130, and side surfaces having a (110) crystal oriented material along a direction parallel to sidewalls 112 and 114. In some embodiments, crystalline defects may that existed in material 122 or 132 near or along the sidewalls 112 and 114 of the STI do not extend into layer 140 (e.g., do not extend into height H4 and width W4). In some embodiments, crystalline defects may exist in material 142 due to defects, including the Stacking faults that originate at the STI sidewalls 112 or 114, do not extend into layer 140 (e.g., do not extend into height H4 and width W4).

Material 142 may have a top surface having a (100) crystal orientation (Miller Index). The top surface of layer 140 may be polished or etched to form a flat surface having a (100) crystal index. Layer 140 may have horizontal width W4 extending across or over the trench (e.g., W1) and portions of top surfaces 116 and 118 of STI regions 108 and 110.

W4 may be greater than (e.g., and include) W3 (e.g., and W1). Layer 140 may have a length L1. In some cases, layer 140 is a single layer of InGaAs or InAs material. In some cases, layer 140 is a multi-stack of InGaAs/InP/InGaAs material.

Layer 140 may have vertical height H4 above or over top surfaces 116 and 118 of STI regions 108 and 110. In some cases, when layer 140 is a multi-stack, height H4 may be a height of between 50 and 300 nanometers (nm). In some cases, when layer 140 is a single layer, height H4 may be a height of between 20 and 300 nanometers (nm). In some cases, H4 is approximately 50 nm. According to some embodiments, the difference in height between the top of layer 130 and the top of layer 140 or layer 150 may be 50 nanometers (nm).

The bottom surface of layer 140 may have the same (100) crystal orientation as that of material 132 (e.g., at its top surface). In some cases, the bottom surface of layer 140 may have the same crystal lattice size as that of material 132 (e.g., at its top surface). Layer 140 may be a relaxed material (e.g., have a non-strained lattice) with respect to its interface with layer 130 (e.g., at its top surface). In some cases, layer 140 has a same lattice constant as the bottom of the layer 120 or that of surface 103. In some cases, layer 140 is lattice matched with respect to layer 130 (e.g., a top surface of material 132). In some cases, layer 140 is fully strained with respect to layer 130 (e.g., a top surface of material 132). The strain may be tensile or compressive strain appropriate to increase carrier mobility.

Figure 4:
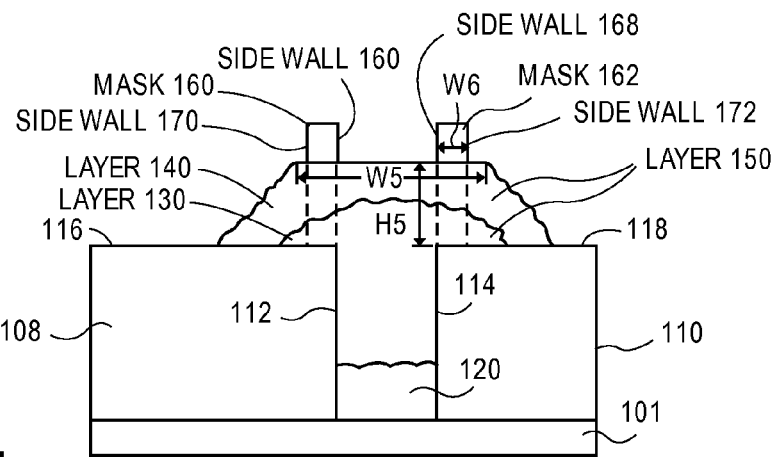
FIG. 4 shows the semiconductor substrate of FIG. 1 after polishing and patterning the epitaxial material formed above the trench and above the STI regions.

FIG. 4 shows the semiconductor substrate of FIG. 1 after polishing and patterning the epitaxial material formed above the trench and above the STI regions. FIG. 4 shows layer 140 polished or planarized to form layer 150. Polishing or planarizing layer 140 may be performed by chemical, physical or mechanical polishing as known in the art to form top planar surface 164 of material 142. Layer 150 may be described as a fourth layer including material 142 and material 132 that is disposed or exists above the top surface of the trench (e.g., withing W1 and L1, above or on top of H1) and STI regions (e.g., over surfaces 116 and 118). Layer 150 may have horizontal width W4 at its base or at top surfaces 116 and 118 of STI regions 108 and 110. Layer 150 may have horizontal width W5 at its top surface and height H5 above portions of top surfaces 116 and 118 of STI regions 108 and 110. W5 may be less than W4 and greater than W3. H5 may be less than H4 and greater than H3. Width W5 may be a width of between 15 and 100 nanometers (nm). In some cases W5 is approximately 20 nm. Height H5 may be a height of between 10 and 150 nanometers (nm). In some cases H5 is approximately 60 nm.

FIG. 4 also shows pattern or masks 160 and 162 formed on portions of polished or planarized top surface 164 of layer 150. In some cases, masks 160 and 162 have width W6 which is less than half of W5. Masks 160 and 162 may have a length L1. Width W6 may be a width of between 5 and 50 nanometers (nm). In some embodiments, width W6 may be a width of between 2 and 5 nanometers (nm). In some cases W6 is approximately 5 nm.

Masks 160 and 162 may have inner sidewalls 166 and 168 above sidewalls 112 and 114. Inner sidewalls 166 and 168 may be planar surfaces parallel to and aligned with (e.g., directly above) planar sidewalls 112 and 114 (e.g., as shown by the dotted line). Masks 160 and 162 may have outer sidewalls 170 and 172 above surfaces 116 and 118. Outer sidewalls 170 and 172 may be planar surfaces parallel to planar sidewalls 112 and 114, and may extend length L above surfaces 116 and 118.

According to some embodiments, W1 may be between 10 and 15 nanometers (nm); H1 may be 350 nanometers (nm); H2 may be 70 nanometers (nm); the difference in height between the top of layer 120 and the top of layer 130 may be 200 nanometers (nm); and the difference in height between the top of layer 130 and the top of layer 140 or layer 150 may be 50 nanometers (nm). Also, L1 may be equal to W1.

Figure 5:
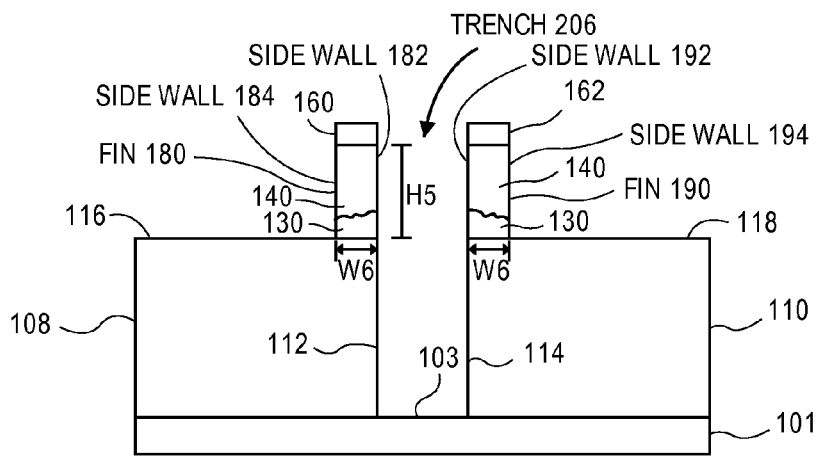
FIG. 5 shows the semiconductor substrate of FIG. 1 after forming fins from the epitaxial material formed above the STI regions.

FIG. 5 shows the semiconductor substrate of FIG. 1 after forming fins from the epitaxial material formed above the STI regions. FIG. 5 shows fins 180 and 190 formed from layer 150, such as by wet or dry etching to remove layers 150, 140, 130 and 120 that are not protected by or below masks 160 and 162. In some embodiments, fins 180 and 190 may be described as "device fins" or "electronic device fins" on which electronic devices may be formed.

Such etching may remove the first width of layers 150, 140, 130 and 120 in and above trench 106 (e.g., and adjacent or proximate to inner sidewalls 166 and 168) to expose surface 103 of the substrate surface. Such etching may also remove the first width of layers 130 and 120 in trench 106 to expose sidewalls 112 and 114. Such etching may remove a width of layers 120, 130 and 140 disposed between sidewalls 166 and 168 to a depth that exposes the top surface of the substrate. In some cases, such etching may include a selective etching, to etch only over the trench (e.g, not etching over top surfaces 116 and 118).

Such etching forms trench 206. Trench 206 may include trench 106, and a width (e.g., W1) and length of trench 106 extending height H5 (and height of masks 160 or 162) above surfaces 116 and 118. Such etching may remove the first width or portions of layers 150, 140, 130 and 120 including any defects may that existed in material 122 or 132 near or along the sidewalls 112 and 114; and any crystalline defects in materials 122, 132 or 142 due to defects, including the Stacking faults that originate at the STI sidewalls 112 or 114. In some embodiments, since the defects (e.g., crystalline defects) in trench 106 have not extended into or do not exist in the lateral epitaxy overgrowth regions (e.g., W6) of layer 140 or material 142, fins 180 and 190 may provide electronic device material (e.g., wells and channels) in which defect free fin based devices may be formed (e.g., in that lateral epitaxy overgrowth region which is layer 140 in the fins).

In some cases, the same or a separate wet or dry etch may be used to remove a width of layers 150, 140 and 130 adjacent to outer sidewalls 170 and 172 and above surfaces 116 and 118 to expose surfaces 116 and 118. Such etching may remove a width of layers 130 and 140 disposed away from the trench to expose the top surfaces 116 and 118. In some cases, such etching may include a selective etching, to etch only over the top surfaces 116 and 118 (e.g., not etching over the trench). In some cases, such etching may be an etch chemistry to etch both, over the top surfaces 116 and 118, and over the trench 106.

FIG. 5 shows fins 180 and 190 formed on portions of top surfaces 116 and 118 above and extending sidewalls 112 and 114. In some cases, fins 180 and 190 have width W6 and height H5 including material 130 and 140 (e.g., as layer 150). Fins 180 and 190 may have a length L1. Fins 180 and 190 may have (e.g., exposed) inner sidewalls 182 and 192 above sidewalls 112 and 114. Inner sidewalls 182 and 192 may be planar surfaces parallel to and aligned with (e.g., directly above) planar sidewalls 112 and 114. Inner sidewalls 182 and 192 may be planar surfaces parallel to and aligned with (e.g., directly below) inner sidewalls 166 and 168. Fins 180 and 190 may have (e.g., exposed) outer sidewalls 184 and 194 above surfaces 116 and 118. Outer sidewalls 184 and 194 may be planar surfaces parallel to planar sidewalls 112 and 114, and may extend length L above surfaces 116 and 118. Outer sidewalls 184 and 194 may be planar surfaces parallel to and aligned with (e.g., directly below) outer sidewalls 170 and 172.

Figure 6:
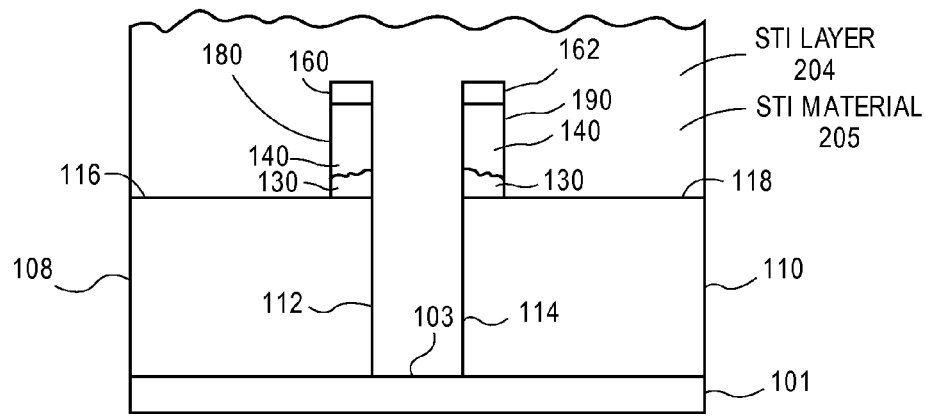
FIG. 6 shows the semiconductor substrate of FIG. 1 after forming a layer of STI material over the fins and trench.

FIG. 6 shows the semiconductor substrate of FIG. 1 after forming a layer of STI material over the fins and trench. FIG. 6 shows a layer 204 of shallow trench isolation (STI) material 205 formed or grown on top surface 103; top surfaces of masks 160 and 162; and top surfaces 116 and 118. In some cases, masks 160 and 162 may be removed and layer 204 formed on top surfaces of fins 180 and 190. Layer 204 may be formed in and fill trench 206. Layer 204 may be formed to height H6 which is greater than Height H5 (and optionally greater than the height of masks 160 or 162). STI material 204 may be formed similar to, have the same crystal orientation as, have the same crystal lattice size, and may be a relaxed material similar to that of material 104. STI material 204 may be a conformal or a blanket layer formed over top surface 103; top surfaces of masks 160 and 162; and top surfaces 116 and 118.

Figure 7:
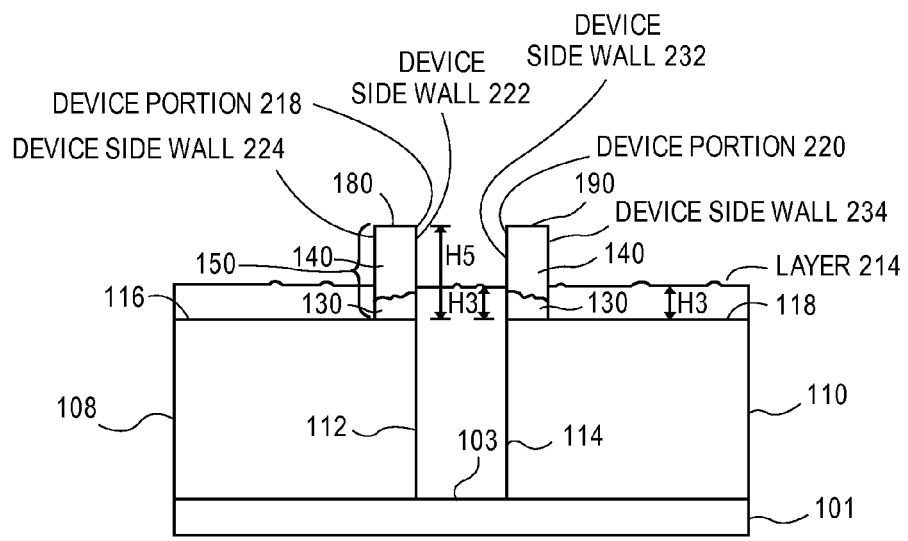
FIG. 7 shows the semiconductor substrate of FIG. 1 after polishing the STI layer formed above the fins, trench and the STI regions; and after recess etching to expose device sidewalls of electronic device fins.

FIG. 7 shows the semiconductor substrate of FIG. 1 after polishing the STI layer formed above the fins, trench and the STI regions; and after recess etching to expose device sidewalls of electronic device fins or portions of fins. FIG. 7 shows fins 180 and 190 after polishing or planarizing STI layer 204 to a height above or greater than height H5 of the top surfaces of fins 180 and 190; and after subsequently recess etching STI layer 204 to height H3 to expose device sidewalls of the fins, and form STI layer 214. Polishing or planarizing STI layer 204 may be performed by chemical, physical or mechanical polishing as known in the art to form a top planar surface of material 205 at a height greater than height H5. After polishing, a blanket wet etch may subsequently recess etch the top surface of the planarized material 205 down to height H3 to expose device layer 140. Such etching may use dilute HF for a few seconds to remove at least height H4 of material 205. Such etching may leave height H3 of material 205 over or above top surfaces 116 and 118; and over or above height H1 in trench 206. Such etching may include exposing sidewalls of material 142 (e.g., layer 140) while not exposing sidewalls of material 132 (e.g., layer 130). In some cases, such etching may etch material 205 down to a height above or equal to height H3 to expose device layer 140 of the fins, but not to expose buffer layer 130. Layer 140 may be above height H3 and exposed above layer 214, while layer 130 is below height H3 and is not exposed above layer 214.

FIG. 7 shows device portions 218 and 220 of fins 180 and 190. In some cases, portions 218 and 220 may be described as "device fins" or "electronic device fins" on which electronic devices may be formed. The device portions include device layer 140 of material 142. In some cases, the device portions exclude buffer layer 130 or material 132. FIG. 7 shows inner (e.g., exposed) device sidewalls 222 and 232 of portions 218 and 220, respectively; and outer (e.g., exposed) device sidewalls 224 and 234 of portions 218 and 220, respectively. In some cases, portions 218 and 220 have width W6 and height H4 of material 142, and length L1. Inner sidewalls 222 and 232 may be planar surfaces parallel to and aligned with (e.g., directly above) planar sidewalls 112 and 114. Outer sidewalls 224 and 234 may be planar surfaces parallel to planar sidewalls 112 and 114, and may extend length L above surfaces 116 and 118.

Sidewalls 222, 224, 232 and 234 may include a sufficient height, width and length of material 242 to provide a well and channel of an electronic device. Sidewalls 222, 224, 232 and 234 may include a sufficient height, width and length of material 242 to have a "fin" electronic device formed in or on them. Such electronic devices may include fin integrated circuit (IC) transistors, resistors, capacitors, etc. in or on the sidewalls. Such devices may include fin metal oxide semiconductor (MOS) transistor devices, such as those used in a complementary metal oxide semiconductor (CMOS) based on movement of electrons in N-type MOS device (n-MOS) channels and movement of positive charged holes in P-type MOS device (p-MOS) channels. In some embodiments, since the defects (e.g., crystalline defects) in trench 106 have not extended into or do not exist in the lateral epitaxy overgrowth regions (e.g., portions 218 and 220), sidewalls 222, 224, 232, and 234 may provide electronic device material (e.g., wells and channels) in which defect free fin based devices may be formed (e.g., in that lateral epitaxy overgrowth region which is portions 218 and 220).

In some embodiments, material 122 of layer 120 may be or may include an N-type InP or GaAs material. Material 132 of layer 130 may be or may include an N-type InAlAs material. Material 142 of layer 140 may be or may include an N-type InGaAs or InAs material. These materials may provide a more defect free device fin of N-type InGaAs or InAs material to be used as a channel of an electronic device (e.g., a PMOS device).

In some embodiments, material 122 of layer 120 may be or may include an P-type Si70Ge30 material (e.g., 70 percent Si and 30 percent Ge). Material 132 of layer 130 may be or may include an P-type Si30Ge70 material. Material 142 of layer 140 may be or may include an P-type Ge material. These materials may provide a more defect free device fin of P-type Ge material to be used as a channel of an electronic device (e.g., an NMOS device).

Figure 8:
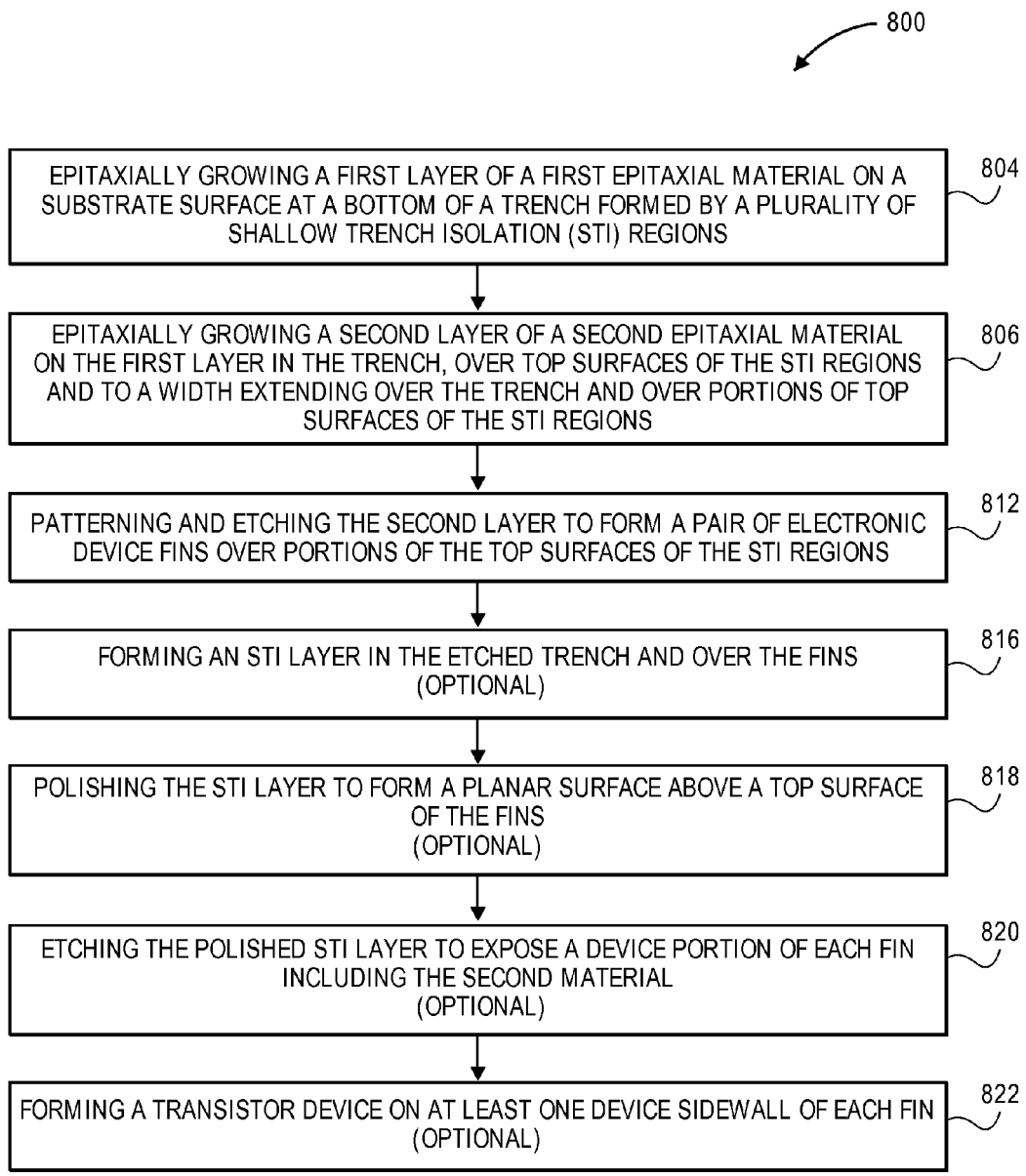
FIG. 8 is an example process for forming a pair of electronic device fins.

FIG. 8 is an example process 800 for forming a pair of electronic device fins. FIG. 8 shows process 800 beginning with block 804 where a first layer of a first epitaxial material is epitaxially grown on a substrate surface at a bottom of a trench formed by a plurality of shallow trench isolation (STI) regions. The STI regions may be formed on a substrate to define trenches between each pair of regions. The STI regions may have STI sidewalls defining a first width W1 and a first height H1 of the trench. The first height H1 may be at least 1.5 times the first width W1. The first width may be between 10-100 nm, and the first height may be between 30-300 nm. The substrate surface may be silicon and has a (100) crystal orientation index. This may include using more than two regions to define each trench. This may include trench 106 being defined by STI regions 108 and 110. Block 804 may include descriptions above for forming trench 106 and growing layer 120 as described for FIGS. 1-3.

Next, at block 806, a second layer of a second epitaxial material is epitaxially grown on the first layer in the trench, over top surfaces of the STI regions and to a width extending over the trench and over portions of top surfaces of the STI regions. Block 806 may include growing the second layer to second height above the first height H1, the second layer having a second width extending over the trench and over portions of top surfaces of the STI regions. The second layer may be a buffer layer grown from a top surface of the first layer and a device layer grown from a top surface of the buffer layer. Block 806 may include descriptions above for growing layer 130 as described for FIGS. 1-3.

Next, at block 812, the second layer is patterned and etched to form a pair of electronic device fins over portions of the top surfaces of the STI regions. Each portion may be proximate to (e.g., next to or adjacent to) a trench sidewall. In some cases, prior to patterning, a top surface of the second layer is polished to form a planar surface having a third height H5 above the first height H1 and over the top surfaces of the STI regions. Etching may be a wet etch. Etching may include etching the second and first layers to (1) remove the first width of the first and second layers from over and in the trench to expose the top surface of the substrate, and (2) remove a width of the second epitaxial layer over portions of the top surfaces of the STI regions away from the trench. Block 812 may include descriptions above for patterning and etching the layer 150 to form a pair of electronic device fins as described for FIG. 4-5 or 4-7.

Next, at optional block 816, an STI layer is formed in the etched trench and over the fins (optional). This block is not performed for some embodiments. Block 816 may include descriptions above for forming STI layer 204 as described for FIG. 6.

Next, at optional block 818, the STI layer is polished to form a planar surface above a top surface of the fins (optional). This block is not performed for some embodiments. Block 818 may include descriptions above for polishing STI layer 204 as described for FIG. 7.

Next, at optional block 820, the polished STI layer is etched to expose a device portion of each fin including the second material (optional). This block is not performed for some embodiments. Block 820 may include descriptions above for etching STI layer 204 as described for FIG. 7.

Next, at optional block 822, a transistor device may be formed on at least one device sidewall of each fin (optional). In some cases block 822 includes forming transistor devices on each device sidewall of each fin (optional). This block is not performed for some embodiments. Block 822 may include descriptions above for forming transistor devices on device sidewall of each fin as described for FIG. 7.

For some embodiments, blocks 816-822 are not performed in process 800. For some embodiments, block 822 is not performed in process 800.

Figure 9:
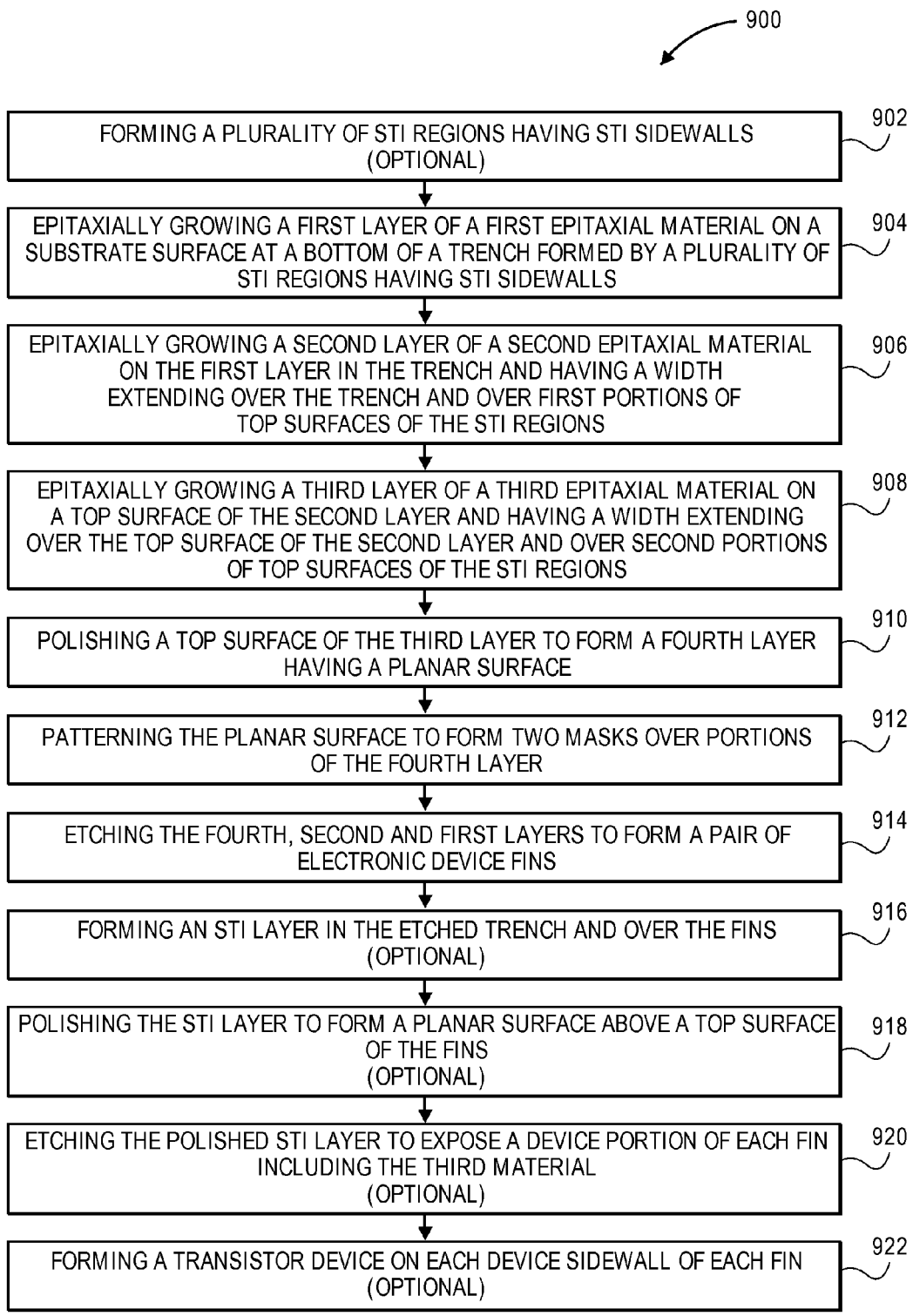
FIG. 9 is an example process for forming a pair of electronic device fins.

FIG. 9 is an example process 900 for forming a pair of electronic device fins. FIG. 9 shows process 900 beginning with optional block 902 where a plurality of STI regions having STI sidewalls are formed on a substrate surface (optional). This block is not performed for some embodiments. The STI regions may be formed to define trenches between each pair of regions. The STI regions may have STI sidewalls defining a first width W1 and a first height H1 of the trench. This may include using more than two regions to define each trench. The first height H1 may be at least 1.5 times the first width W1. The first width may be between 10-100 nm, and the first height may be between 30-300 nm. The substrate surface may be silicon and has a (100) crystal orientation index. This may include forming a blanket layer of STI material, then patterning and etching that material to form STI regions 108 and 110. Block 902 may include descriptions above for forming trench 106 as described for FIGS. 1-2.

Next, at block 904, a first layer of a first epitaxial material is epitaxially grown on a substrate surface at a bottom of a trench formed by a plurality of shallow trench isolation (STI) regions having STI sidewalls. The first layer may have a second height H2 that is less than the first height H1, and a second width W2 less than or equal to the first width W1. Block 904 may include descriptions above for forming or growing layer 120 as described for FIGS. 1-3.

Next, at block 906, a second layer of a second epitaxial material is epitaxially grown on the first layer in the trench, and over top surfaces of the STI regions and extending over the trench and over first portions of top surfaces of the STI regions. Block 906 may include growing the second layer to a third height H3 above the first height H1, the second layer having a third width extending over the trench and over first portions of top surfaces of the STI regions. The second layer may be a buffer layer grown from a top surface of the first layer and extending above and over the STI regions. Block 906 may include descriptions above for growing layer 130 as described for FIGS. 1-3.

Next, at block 908, a third layer of a third epitaxial material is epitaxially grown on a top surface of the second layer and having a width extending over the top surface of the second layer and over second portions of top surfaces of the STI regions. Block 908 may include growing the third layer to a fourth height H4 above the first height H1, the fourth height H4 greater than the third height H3, and the third layer having a fourth width W4 extending over the top surface of the second layer and over second portions of top surfaces of the STI regions. The third layer may be a device layer grown from a top surface of the second layer, and the device layer may have a same lattice constant as the bottom of the top surface of first layer. Block 908 may include descriptions above for growing layer 140 as described for FIGS. 1-3.

Next, at block 910, the top surface of the third layer is polished to form a fourth layer having a planar surface. The fourth layer may include the second epitaxial material and the third epitaxial material. The planar surface may have with a fifth width W5, the fourth layer may have a fifth height H5 above the first height H1 and over the top surfaces of the STI regions, the fifth height H5 may be less than the fourth height H4 and greater than the third height H3. Block 910 may include descriptions above for polishing layer 140 to form layer 150 as described for FIG. 4.

Next, at block 912, the planar surface is patterned to form two masks over portions of the fourth layer. This may include patterning the planar surface to form two masks over portions of the fifth width W5, the portions each having a sixth width less than half of the fifth width, the portions each proximate to or adjacent to the trench sidewalls, the portions each over the top surfaces of the STI regions. Block 912 may include descriptions above for patterning the planar top surface of layer 150 to form a pair of electronic device fins as described for FIGS. 4-5.

Next, at block 914, the fourth, second and first layers are etched to form a pair of electronic device fins over portions of the top surfaces of the STI regions. Each fin may be proximate to (e.g., next to or adjacent to) a trench sidewall. Etching may be a wet etch. Etching may include etching to remove the first width of the first, second and fourth epitaxial layers in the trench to expose the top surface of the substrate 103; and to remove a width of the second and fourth epitaxial layers over portions of the fourth width and away from the trench to expose the top surfaces of the STI regions. Wet etching may include forming a pair electronic device fins including (1) a portion of the second material having the third width W3 extending over the first portions of top surfaces of the STI regions, and (2) a portion of the third material having the fourth width W4 extending over the top surface of the second layer and over the first portions of top surfaces of the STI regions. Block 914 may include descriptions above for etching layer 150 to form a pair of electronic device fins as described for FIG. 4-5 or 4-7.

Next, at optional block 916, an STI layer is formed in the etched trench and over the fins (optional). This block is not performed for some embodiments. Block 916 may include descriptions above for forming STI layer 204 as described for FIG. 6.

Next, at optional block 918, the STI layer is polished to form a planar surface above a top surface of the fins (optional). This block is not performed for some embodiments. Block 918 may include descriptions above for polishing STI layer 204 as described for FIG. 7.

Next, at optional block 920, the polished STI layer is etched to expose a device portion of each fin including the third material (optional). This block is not performed for some embodiments. Block 920 may include descriptions above for etching STI layer 204 as described for FIG. 7.

Next, at optional block 922, a transistor device may be formed on each device sidewall of each fin (optional). In some cases block 922 includes forming transistor devices on fewer than each device sidewall of each fin (optional). This block is not performed for some embodiments. Block 922 may include descriptions above for forming transistor devices on device sidewall of each fin as described for FIG. 7.

For some embodiments, blocks 902 and 916-922 are not performed in process 900. For some embodiments, blocks 902 and 922 are not performed in process 900. For some embodiments, blocks 916-922 are not performed in process 900. For some embodiments, block 922 is not performed in process 900.

By forming electronic device fins 180 and 190 (or portions 218 and 220) as described herein, it is possible to avoid or minimize crystalline defects that result in the fins due to or from a large lattice mismatch in materials when certain materials (e.g., type III-V, or Ge materials) are epitaxially grown on a Silicon material substrate, in trenches between STI regions. Such defects include those trapped or along the sidewall of the STI forming the trenches, and other defects, including the Stacking faults that originate at the STI sidewall, that still remain within the trench. By avoiding or minimizing these crystalline defects can lead to yield and variation issues in a device built on a device layer or device sidewall of the fins. Forming fins 180 and 190 (or portions 218 and 220) may help grow defect free regions outside the trench which can be used to make devices instead of attempting to reduce the stacking faults (and dislocations) within the trench. It may also cause the quality or defects in the epitaxial materials within the trench to be irrelevant or not effect the quality fins 180 and 190 (or portions 218 and 220).

Figure 10:
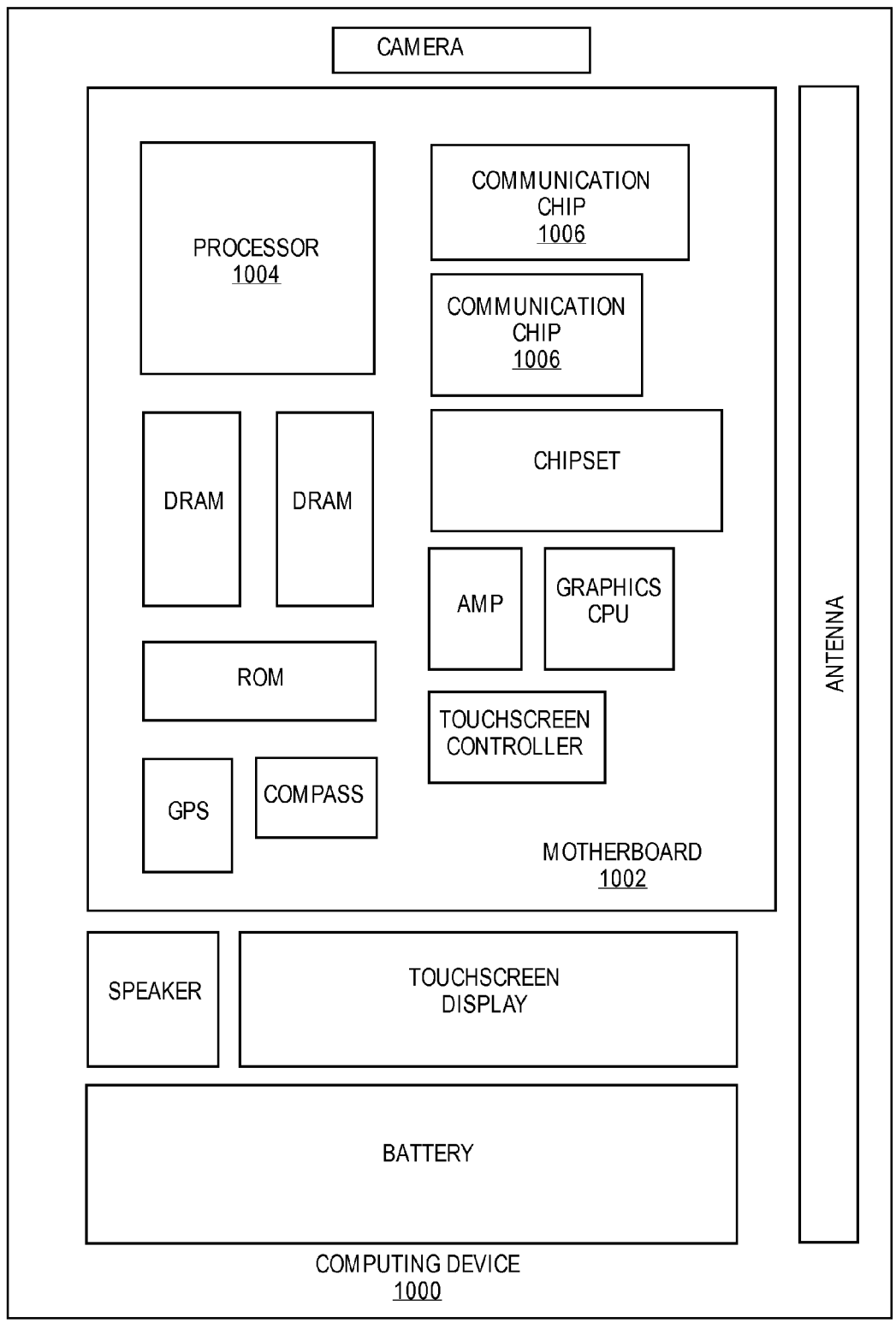
FIG. 10 illustrates a computing device in accordance with one implementation.

FIG. 10 illustrates a computing device 1000 in accordance with one implementation. The computing device 1000 houses board 1002. Board 1002 may include a number of components, including but not limited to processor 1004 and at least one communication chip 1006. Processor 1004 is physically and electrically connected to board 1002. In some implementations at least one communication chip 1006 is also physically and electrically connected to board 1002. In further implementations, communication chip 1006 is part of processor 1004.

Depending on its applications, computing device 1000 may include other components that may or may not be physically and electrically connected to board 1002. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

Communication chip 1006 enables wireless communications for the transfer of data to and from computing device 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chip 1006 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

Processor 1004 of computing device 1000 includes an integrated circuit die packaged within processor 1004. In some implementations, the integrated circuit die includes a multilevel interconnect including monoliths of wiring lines and vias to that allows for air gaps in the interconnect assembly such as described with reference to FIGS. 1-6. The term "processor" may refer to any device or portion of a device that processes electronic data from registers and/or memory to transform that electronic data into other electronic data that may be stored in registers and/or memory.

Communication chip 1006 also includes an integrated circuit die packaged within communication chip 1006. In accordance with another implementation, a package including a communication chip incorporates one or more capacitors such as described above.

In further implementations, another component housed within computing device 1000 may contain a microelectronic package including an integrated circuit die such as described above.

In various implementations, computing device 1000 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, computing device 1000 may be any other electronic device that processes data.

EXAMPLES

The following examples pertain to embodiments.

Example 1 is a method to form a pair of electronic device fins including epitaxially growing a first layer of a first epitaxial material on a substrate surface at a bottom of a trench formed by a plurality of shallow trench isolation (STI) regions having STI sidewalls defining a first width and a first height of the trench; epitaxially growing a second layer of a second epitaxial material on the first layer in the trench and over top surfaces of the STI regions to second height above the first height, the second layer having a second width extending over the trench and over portions of top surfaces of the STI regions; and patterning and etching the second layer to form a pair of electronic device fins over portions of the top surfaces of the STI regions, the portions each proximate to the trench sidewalls.

In Example 2, etching in the method of Example 1 includes etching the second and first layers to (1) remove the first width of the first and second layers from over and in the trench to expose the top surface of the substrate, and (2) remove a width of the second epitaxial layer over portions of the top surfaces of the STI regions away from the trench.

In Example 3, the method of Example 1 further includes forming an STI layer in the etched trench and over the fins; polishing the STI layer to form a planar surface above a top surface of the fins; and etching the polished STI layer to expose a device portion of each fin including the second material.

In Example 4, the method of Example 3 further includes forming a transistor device on at least one device sidewall of each fin.

In Example 5, the first height of Example 1 is at least 1.5 times the first width.

In Example 6, the first width of Example 1 is between 10-100 nano-meters (nm), and first height is between 30-300 nm.

In Example 7, the substrate surface of Example 1 is silicon and has a (100) crystal orientation index.

In Example 8, the second layer of Example 1 includes a buffer layer grown from a top surface of the first layer and a device layer grown from a top surface of the buffer layer.

In Example 9, the method of Example 1 further includes, prior to patterning, polishing a top surface of the second layer to form a planar surface having a third height above the first height and over the top surfaces of the STI regions.

Example 10 is a method to form a pair of electronic device fins including epitaxially growing a first layer of a first epitaxial material on a substrate surface at a bottom of a trench formed by a plurality of shallow trench isolation (STI) regions having STI sidewalls defining a first width and a first height of the trench, wherein the first layer has a second height that is less than the first height; epitaxially growing a second layer of a second epitaxial material on the first layer in the trench and over top surfaces of the STI regions to third height above the first height, the second layer having a third width extending over the trench and over first portions of top surfaces of the STI regions; epitaxially growing a third layer of a third epitaxial material on a top surface of the second layer to a fourth height above the first height, the fourth height greater than the third height, and the third layer having a fourth width extending over the top surface of the second layer and over second portions of top surfaces of the STI regions; polishing a top surface of the third layer to form a fourth layer having a planar surface with a fifth width, the fourth layer having a fifth height above the first height and over the top surfaces of the STI regions, the fifth height less than the fourth height and greater than the third height; patterning the planar surface to form two masks over portions of the fifth width, the portions each having a sixth width less than half of the fifth width, the portion each proximate to the trench sidewalls, the portions each over the top surfaces of the STI regions; and etching the fourth, second and first layers to form a pair of electronic device fins: to remove the first width of the first, second and fourth epitaxial layers in the trench to expose the top surface of the substrate; to remove a width of the second and fourth epitaxial layers over portions of the fourth width and away from the trench to expose the top surfaces of the STI regions.

In Example 11, the first height of Example 10 is at least 1.5 times the first width, and wherein the first layer has a second width less than or equal to the first width.

In Example 12, the second layer of Example 10 includes a buffer layer grown from a top surface of the first layer.

In Example 13, the third layer of Example 10 includes a device layer grown from a top surface of the second layer.

In Example 14, the device layer of Example 13 has a same lattice constant as the top surface of the second layer.

In Example 15, the fourth layer of Example 10 includes s the second epitaxial material and the third epitaxial material.

In Example 16, wet etching of Example 10 includes forming a pair electronic device fins including (1) a portion of the second material having the third width extending over the first portions of top surfaces of the STI regions, and (2) a portion of the third material having the fourth width extending over the top surface of the second layer and over the first portions of top surfaces of the STI regions.

In Example 17, the method of Example 10 further includes forming an STI layer in the etched trench and over the fins; polishing the STI layer to form a planar surface above a top surface of the fins; and etching the polished STI layer to expose a device portion of each fin including the third material, each device portion having two device sidewalls.

In Example 18, the method of Example 10 further includes forming a transistor device on the two device sidewalls of each fin.

Example 19, is a method to form a pair of electronic device fins including epitaxially growing a first layer of a first epitaxial material on a substrate surface at a bottom of a trench formed by a plurality of shallow trench isolation (STI) regions having STI sidewalls defining a first width and a first height of the trench; epitaxially growing a second layer of a second epitaxial material on the first layer in the trench and over top surfaces of the STI regions to second height above the first height, the second layer having a second width extending over the trench and over portions of top surfaces of the STI regions; patterning and etching the second layer to form a pair of electronic device fins over portions of the top surfaces of the STI regions, the portions each proximate to the trench sidewalls; forming an STI layer in the etched trench and over the fins; polishing the STI layer to form a planar surface above a top surface of the fins; etching the polished STI layer to expose a device portion of each fin including the second material; and forming a transistor device on the two device sidewalls of each fin.

In Example 20, wet etching of Example 19 includes etching the second and first layers to (1) remove the first width of the first and second layers from over and in the trench to expose the top surface of the substrate, and (2) remove a width of the second epitaxial layer over portions of the top surfaces of the STI regions away from the trench.

In the description above, for the purposes of explanation, numerous specific details have been set forth in order to provide a thorough understanding of the embodiments. It will be apparent however, to one skilled in the art, that one or more other embodiments may be practiced without some of these specific details. The particular embodiments described are not provided to limit the embodiments of the invention but to illustrate it. The scope of the embodiments of invention is not to be determined by the specific examples provided above but only by the claims below. In other instances, well-known structures, devices, and operations have been shown in block diagram form or without detail in order to avoid obscuring the understanding of the description. Where considered appropriate, reference numerals or terminal portions of reference numerals have been repeated among the figures to indicate corresponding or analogous elements, which may optionally have similar characteristics.

It should also be appreciated that reference throughout this specification to "one embodiment", "an embodiment", "one or more embodiments", or "different embodiments", for example, means that a particular feature may be included in the practice of the embodiments. Similarly, it should be appreciated that in the description various features are sometimes grouped together in a single embodiment, figure, or description thereof for the purpose of streamlining the disclosure and aiding in the understanding of various inventive aspects. This method of disclosure, however, is not to be interpreted as reflecting an embodiment that requires more features than are expressly recited in each claim. Rather, as the following claims reflect, inventive aspects of embodiments that may lie in less than all features of a single disclosed embodiment. For example, although the descriptions and figures above describe forming a single pair of electronic device fins, the descriptions and figures above can be applied to form one pair of N-type fins using trench 106, and one a pair of P-type fins using adjacent trench 5. By masking off on of the trenches (and optionally the area around that trench) the N-type fins or P-type fins may be formed simultaneously or one before the other. Thus, the claims following the Detailed Description are hereby expressly incorporated into this Detailed Description, with each claim standing on its own as a separate embodiment of the invention.

The invention claimed is:

1. A method to form a pair of electronic device fins comprising:
   epitaxially growing a first layer of a first epitaxial material on a substrate surface at a bottom of a trench formed by a plurality of shallow trench isolation (STI) regions having STI sidewalls defining a first width and a first height of the trench;
   epitaxially growing a second layer of a second epitaxial material on the first layer in the trench and over top surfaces of the STI regions to second height above the first height, the second layer having a second width extending over the trench and over portions of top surfaces of the STI regions; and
   patterning and etching the second layer to form a pair of electronic device fins over portions of the top surfaces of the STI regions, the portions each proximate to the trench sidewalls, wherein etching includes etching the second layer to remove the first width of the second layer from over and in the trench to expose at least a top surface of the first layer.

2. The method of claim 1, wherein etching includes etching the second and first layers to remove the first width of the first and second layers from over and in the trench to expose the substrate surface at the bottom of the trench.

3. The method of claim 1, further comprising:
   forming an STI layer in the etched trench and over the pair of electronic device fins;
   polishing the STI layer to form a planar surface above a top surface of the pair of electronic device fins; and
   etching the polished STI layer to expose a device portion of each fin of the pair of electronic device fins, the device portion including the second material.

4. The method of claim 3, further comprising:
   forming a transistor device on at least one device sidewall of each fin of the pair of electronic device fins.

5. The method of claim 1, wherein a distance of the first height is at least 1.5 times a distance of the first width.

6. The method of claim 1, wherein the first width is between 10 and 100 nano-meters (nm), and first height is between 30 and 300 nm.

7. The method of claim 1, wherein the substrate surface is silicon and has a (100) crystal orientation index.

8. The method of claim 1, wherein the second layer comprises (1) a buffer layer grown from a top surface of the first layer and (2) a device layer grown from a top surface of the buffer layer.

9. The method of claim 1, further comprising, prior to patterning, polishing a top surface of the second layer to form a planar surface of the second layer having a third height above the first height and over the top surfaces of the STI regions.

10. A method to form a pair of electronic device fins comprising:
    epitaxially growing a first layer of a first epitaxial material on a substrate surface at a bottom of a trench formed by a plurality of shallow trench isolation (STI) regions having STI sidewalls defining a first width and a first height of the trench, wherein the first layer has a second height that is less than the first height;
    epitaxially growing a second layer of a second epitaxial material on the first layer in the trench and over top surfaces of the STI regions to third height above the first height, the second layer having a third width extending over the trench and over first portions of top surfaces of the STI regions;
    epitaxially growing a third layer of a third epitaxial material on a top surface of the second layer to a fourth height above the first height, the fourth height greater than the third height, and the third layer having a fourth width extending over the top surface of the second layer and over second portions of top surfaces of the STI regions;
    polishing a top surface of the third layer to form a fourth layer having a planar surface with a fifth width, the fourth layer having a fifth height above the first height and over the top surfaces of the STI regions, the fifth height less than the fourth height and greater than the third height;
    patterning the planar surface to form two masks over two portions of the fifth width, the two portions each having a sixth width less than half of the fifth width, the two portions each proximate to the trench sidewalls, the two portions each over the top surfaces of the STI regions; and
    etching the fourth, second and first layers to form a pair of electronic device fins, wherein etching includes:
       removing the first width of the first, second and fourth epitaxial layers in the trench to expose the substrate surface at the bottom of the trench;
    removing a width of the second and fourth epitaxial layers over portions of the fourth width and away from the trench to expose the top surfaces of the STI regions.

11. The method of claim 10, wherein a distance of the first height is at least 1.5 times a distance of the first width, and wherein the first layer has a second width less than or equal to the first width.

12. The method of claim 10, wherein the second layer comprises a buffer layer grown from a top surface of the first layer.

13. The method of claim 10, wherein the third layer comprises a device layer grown from a top surface of the second layer.

14. The method of claim 13, wherein the device layer has a same lattice constant as the top surface of the second layer.

15. The method of claim 10, wherein the fourth layer includes the second epitaxial material and the third epitaxial material.

16. The method of claim 10, wherein the pair electronic device fins include (1) a portion of the second material having the third width extending over the first portions of top surfaces of the STI regions, and (2) a portion of the third material having the fourth width extending over the top surface of the second layer and over the first portions of top surfaces of the STI regions.

17. The method of claim 10, further comprising:
forming an STI layer in the etched trench and over the pair of electronic device fins;
polishing the STI layer to form a planar surface above a top surface of the pair of electronic device fins; and
etching the polished STI layer to expose a device portion of each fin of the pair of electronic device fins, each device portion including the third material and having two device sidewalls.

18. The method of claim 17, further comprising forming a transistor device on the two device sidewalls of each fin of the pair of electronic device fins.

19. The method of claim 1, wherein epitaxially growing the second layer includes epitaxially growing the second layer of the second epitaxial material from the first layer in the trench.

20. The method of claim 1, wherein etching includes etching the second layer to remove the first width and at least the second height of the second layer from over and in the trench.

21. The method of claim 1, wherein etching includes etching the second layer to remove the first width of the second layer to a depth that is at least below the top surfaces of the STI regions from over and in the trench.

22. The method of claim 2, wherein etching includes etching the second and first layers to remove a width of the second epitaxial layer over portions of the top surfaces of the STI regions away from the trench.

23. The method of claim 10, wherein epitaxially growing the second layer includes epitaxially growing the second layer of the second epitaxial material from the first layer in the trench; and wherein epitaxially growing the third layer includes epitaxially growing the third layer of the third epitaxial material from the top surface of the second layer.

* * * * *